United States Patent
Sodani et al.

(10) Patent No.: US 11,340,673 B1
(45) Date of Patent: May 24, 2022

(54) SYSTEM AND METHOD TO MANAGE POWER THROTTLING

(71) Applicant: Marvell Asia Pte, Ltd., Singapore (SG)

(72) Inventors: Avinash Sodani, San Jose, CA (US); Srinivas Sripada, Roseville, CA (US); Ramacharan Sundararaman, San Jose, CA (US); Chia-Hsin Chen, Santa Clara, CA (US); Nikhil Jayakumar, San Jose, CA (US)

(73) Assignee: Marvell Asia Pte Ltd, Singapore (SG)

( * ) Notice: Subject to any disclaimer, the term of this patent is extended or adjusted under 35 U.S.C. 154(b) by 174 days.

(21) Appl. No.: 16/864,076

(22) Filed: Apr. 30, 2020

(51) Int. Cl.

| | |
|---|---|
| *G06F 1/00* | (2006.01) |
| *G06F 1/26* | (2006.01) |
| *G06F 1/10* | (2006.01) |
| *G11C 19/00* | (2006.01) |
| *H03L 7/08* | (2006.01) |
| *G06N 20/00* | (2019.01) |
| *G06F 1/3203* | (2019.01) |

(52) U.S. Cl.
CPC .................. *G06F 1/26* (2013.01); *G06F 1/10* (2013.01); *G06F 1/3203* (2013.01); *G06N 20/00* (2019.01); *G11C 19/00* (2013.01); *H03L 7/08* (2013.01)

(58) Field of Classification Search
CPC .. G06F 1/26; G06F 1/10; G06N 20/00; G11C 19/00; H03L 7/08
See application file for complete search history.

(56) References Cited

U.S. PATENT DOCUMENTS

| | | | |
|---|---|---|---|
| 9,577,615 B1* | 2/2017 | Ganusov | H03K 3/356156 |
| 10,049,177 B1* | 8/2018 | Devlin | G06F 30/34 |
| 2002/0104031 A1* | 8/2002 | Tomlinson | G06F 1/24 |
| | | | 713/320 |
| 2003/0014682 A1* | 1/2003 | Schmidt | G06F 1/324 |
| | | | 713/500 |
| 2004/0195674 A1* | 10/2004 | Gunther | G06F 1/3237 |
| | | | 257/706 |
| 2004/0215993 A1* | 10/2004 | Han | G06F 1/10 |
| | | | 713/400 |
| 2006/0236147 A1* | 10/2006 | Best | G06F 1/12 |
| | | | 713/400 |
| 2012/0099580 A1* | 4/2012 | Cimini, Jr. | H04L 27/2621 |
| | | | 370/342 |
| 2012/0224602 A1* | 9/2012 | Crafts | G01K 15/005 |
| | | | 374/1 |
| 2013/0262908 A1* | 10/2013 | Gomyo | G06F 1/26 |
| | | | 713/501 |
| 2014/0380071 A1* | 12/2014 | Lee | G06F 1/3206 |
| | | | 713/321 |
| 2015/0177824 A1* | 6/2015 | Ganpule | G06F 1/324 |
| | | | 713/322 |
| 2017/0108908 A1* | 4/2017 | Kruglick | G06F 1/3203 |
| 2018/0232033 A1* | 8/2018 | Gu | G06F 1/3296 |
| 2020/0310510 A1* | 10/2020 | Belagal Math | G06N 20/00 |

\* cited by examiner

*Primary Examiner* — Volvick Derose (57) ABSTRACT

A power throttling engine includes a register configured to receive a power throttling signal. The power throttling engine further includes a decoder configured to generate a vector based on a value of the power throttling signal. The value of the power throttling signal is an amount of power throttling of a device. The power throttling engine further includes a clock gating logic configured to receive the vector and further configured to receive a clocking signal. The clock gating logic is configured to remove clock edges of the clocking signal based on the vector to generate a throttled clocking signal.

25 Claims, 11 Drawing Sheets

SYSTEM AND METHOD TO MANAGE POWER THROTTLING

BACKGROUND

During chip operation, power drawn may vary with chip activity. A chip may be a hardware-based machine learning (ML) system, e.g., application specific integrated circuit (ASIC), that typically includes multiple cores/subsystems (blocks and tiles), each having its own processing units and on-chip memory (OCM). The ML system may transmit data between various components, e.g., a double data rate (DDR) memory, the processing tiles, etc., such that the data can be processed by the processing units for various ML operations. During high chip activity more power may be supplied and during low chip activity less power may be supplied, causing current and/or voltage to change accordingly. During operation, chip activity may increase very quickly, resulting in an increase in the current. Sudden surges in power typically occur due to high performance and low latency requirements, e.g., in ML ASIC. These sudden surges may cause the power draw and/or thermal generation to exceed the amount supported by the system.

Power being consumed by a chip, e.g., a central processing unit (CPU), is conventionally inferred from monitoring the chip activity, e.g., number of instructions, number of memory accesses, types of instructions, clock frequency, etc. The chip activity may be altered, e.g., interrupt generation to temporarily pause operations, reducing clock frequency, etc., based on the inferred power consumption. However, the amount of power is only inferred and as such is inaccurate. Unfortunately, there are currently no methods of directly and accurately monitoring and throttling power consumption of a chip in order to fit its power consumption to a desired power profile. Moreover, changing the clock frequency to throttle power consumption may cause unintended consequences in other parts of a chip.

The foregoing examples of the related art and limitations related therewith are intended to be illustrative and not exclusive. Other limitations of the related art will become apparent upon a reading of the specification and a study of the drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein. It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

In some embodiments, the core of the programmable hardware architecture is configured to interpret a plurality of ML commands/instructions for a ML operation and/or data received from the host and coordinate activities of the streaming and the inference engines based on the data in the received ML commands. The inference engine may include a dense operation engine and an irregular operation engine. The dense operation engine is an engine that is optimized to efficiently process dense data with regular operations, e.g., matrix operations such as multiplication, matrix manipulation, tan h, sigmoid, etc. On the other hand the irregular operation engine is an engine that is optimized to efficiently process sporadic data with irregular operations, e.g., memory transpose, addition operation, operations on irregular data structures (such as trees, graphs, and priority queues). According to some embodiments, the core may coordinate some of the instructions received from the host to be processed. In some embodiments, the core may be a general processor, e.g., a CPU, etc. The inference engine is configured to process the instruction/data streams received from the data/instruction stream engines for the ML operation according to the programming instructions received from the instruction/data streaming engines.

It is appreciated that the system may include a plurality of cores, as described above. The host may control the cores and an event, e.g., an instruction, may cause a surge of current. In some embodiments, a central processing unit such as the host may fan out to all cores and halt their activities to process an instruction and subsequently proceed with restarting the cores activities, causing a change in load in a short interval.

A new power measurement and fitting to a desired power profile is proposed. Power drawn by a chip, e.g., ML ASIC, is directly measured. The desired power profile may be defined by the amount of power draw and duration of the power draw, e.g., multiple power draws and limits over multiple durations of time. For example, an amount of sudden power surge may be permitted for a short period of time but may be unacceptable over an extended period of time. The desired power profile may be specified by an administrator and in some embodiments may be user programmable. Once the power drawn by the chip is directly measured, e.g., using a sensor, a resistor, etc., it is tracked and averaged over a period of time (i.e. both instantaneous power and average). Comparing the power drawn, e.g., instantaneous power, average power over a certain period, etc., with the limits set out by the desired power profile indicates whether power throttling is desired and if so by how much. For example, if power consumption exceeds that as indicated by the desired power profile for a certain period, then power throttling may be initiated and the amount of power throttling may also be determined. In other words, the power being consumed by a chip is fitted to that of a desired power profile, as programmed. Accordingly, power throttling and fitting of power consumption to that of the desired power profile is programmable.

It is appreciated that the amount of power throttling may differ depending on the severity of the power surge. For a nonlimiting example, while in some instances a 10% power throttling may be deemed sufficient, in other embodiments a 70% power throttling may be deemed necessary. In some embodiments, power throttling is achieved by taking an edge of a main clock out, e.g., taking an edge out of every 4 clock cycles (i.e. 25% throttling), taking an edge out of every 3 clock cycles (i.e. 33⅓% power throttling), etc. In other words, the clock pulse is squashed and the duty cycle of the clock is changed without changing the frequency, therefore eliminating a need to change the chip architecture to adapt to different clocking mechanisms. By taking away some of the edges without changing the width of the pulses, the proposed approach allows clock frequency to be dialed up and down efficiently without requiring the chip to accommodate pulses of varying width.

Accordingly, power consumption of the chip is reduced as there are fewer actions being triggered. Throttling continues as long as the measured power (e.g., instantaneous power or average power) is above a certain threshold (i.e. as long as the measured power does not fit the desired power profile). Once the measured power is below that threshold, power throttling is reversed and transitions into a recovery mode but power consumption is still monitored to make any additional power throttling changes, as needed. It is appreciated that the power consumption event that triggered power throttling along with the amount of power throttling may be tracked.

It is appreciated that in some embodiments, thermal performance of the chip may similarly be monitored, e.g., using thermal diodes throughout the chip. The measured thermal value may be converted into a digital format. The chip may similarly have a desired temperature profile, e.g., a sudden temperature spike may be acceptable for a short period of time but unacceptable over a long period of time. The measured thermal performance, e.g., instantaneous and averaged, may be compared to the desired temperature profile and corrective action may be taken similar to that of power throttling, as described above. In some embodiments, both power throttling signal and thermal signal may be triggered, indicating that a corrective action is needed. It is appreciated that throttling power is a corrective action for both because lowering power consumption not only fits the power consumption to the desired power profile but also reduces the temperature as fewer instructions are being processed. Accordingly, in some embodiments, the power throttling signal is compared to the thermal signal and the greater of the two may be selected to throttle the power. Throttling the power occurs, as described above.

Figure 1:
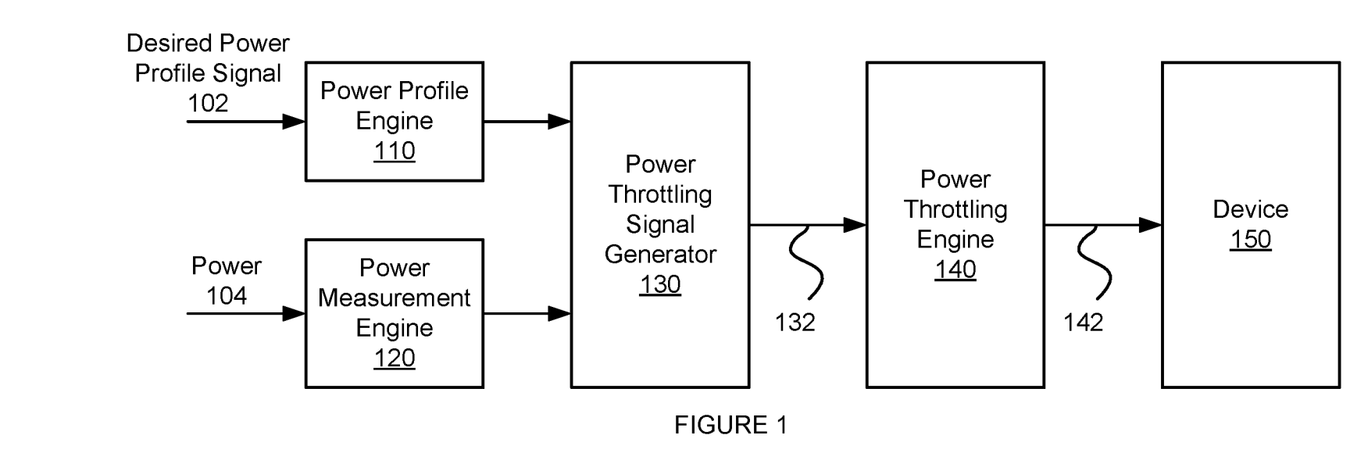
FIG. 1 depicts an illustrative example of a hardware-based programmable architecture configured to measure power drawn and to throttle power, if necessary, to fit the drawn power to that of a desired power profile according to one aspect of the present embodiments.

FIG. 1 depicts an illustrative example of a hardware-based programmable architecture configured to measure power drawn and to throttle power, if necessary, to fit the drawn power to that of a desired power profile, according to one aspect of the present embodiments. The system includes a power profile engine 110, a power measurement engine 120, a power throttling signal generator 130, a power throttling engine 140, and a device 150, e.g., ML ASIC. The power profile engine 110 is configured to receive the desired power profile signal 102, e.g., from a system administrator, user, etc. The desired power profile signal 102 may be user programmable. The power measurement engine 120 is configured to directly measure the power being drawn by the device 150. The power throttling signal generator 130 receives the desired power profile from the power profile engine 110 and it further receives the measured power being drawn from the power measurement engine 120. The power throttling signal generator 130 generates a signal 132 that determines whether any power throttling is needed and if so, by how much. The power throttling signal 132 is transmitted to the power throttling engine 140 to generate the throttled clocking signal 142. The throttled clocking signal 142 is a modified version of the clocking signal where certain clocking signal pulses are squashed, thereby changing the duty cycle of the clock without changing the frequency, therefore eliminating a need to change the chip architecture to adapt to different clocking mechanisms. In other words the clock frequency is dialed up and down efficiently without requiring the chip to accommodate pulses of varying width. Accordingly, power consumption of the device 150 may be adjusted to fit its power consumption to that of the desired power profile. It is appreciated that device 150 may be an ML ASIC hardware-based system/architecture device configured to support machine learning. In some embodiments, the device 150 may include a plurality of chips. A power monitoring and controlling mechanism, as illustrated, ensures that the power draw is controlled.

Although the diagrams depict components as functionally separate, such depiction is merely for illustrative purposes. It will be apparent that the components portrayed in this figure can be arbitrarily combined or divided into separate software, firmware and/or hardware components. Furthermore, it will also be apparent that such components, regardless of how they are combined or divided, can execute on the same host or multiple hosts, and wherein the multiple hosts can be connected by one or more networks. Each of the engines in the architecture is a dedicated hardware block/component including one or more microprocessors and on-chip memory units storing software instructions programmed by a user for various machine learning operations. When software instructions are executed by the microprocessors, each of the hardware components becomes a special purposed hardware component for practicing certain machine learning functions as discussed in detail below. In some embodiments, the architecture is on a single chip, e.g., a system-on-chip (SOC).

Figure 2:
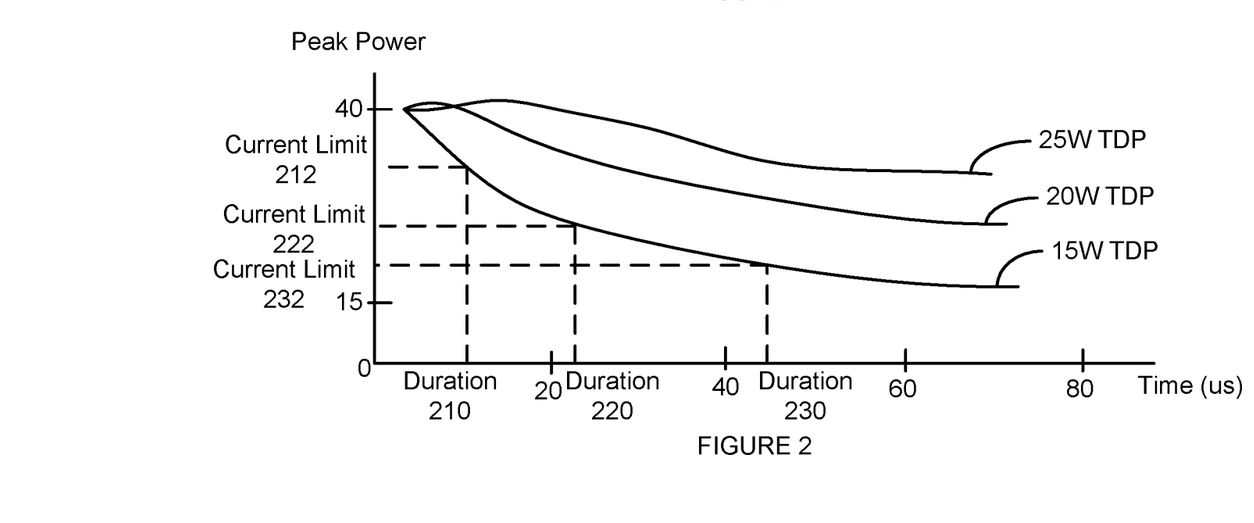
FIG. 2 shows an illustrative example of a desired power profile according to one aspect of the present embodiments.

In the example of FIG. 1, the power profile engine 110 is configured to receive the desired power profile signal 102. It is appreciated that the desired power profile signal 102 may include a plurality of current limits associated with a plurality of durations. For example, referring now to FIG. 2, current limit 212 is associated with duration 210, current limit 222 is associated with duration 220, and current limit 232 is associated with duration 230 for a 15 W thermal design power (TDP). Various current limits and durations define the desired power profile, as illustrated. It is appreciated that the desired power profile may be associated with various TDPs, e.g., 15 W, 20 W, 25 W, etc. As illustrated the desired power profile may indicate that a sudden power surge may be acceptable for a short period of time but may not be sustainable. Moreover, it is appreciated that any number of current limits and associated durations may be defined and that showing only 3 current limits and 3 durations is for illustration purposes should not be construed as limiting the scope of the embodiments. Furthermore, it is appreciated that even though the desired power profile is defined using current limits and durations associated therewith, it may be defined in other fashions, e.g., power expressed in watts, etc. As such, any discussions of the desired power profile and its current limits is for illustrative purposes and should not be construed as limiting the embodiments.

Referring back to FIG. 1, the power measurement engine 120 is a component positioned at a gateway to the system or the device 150. As such, the power measurement engine 120 is configured to measure the power 104 being consumed, e.g., by the device 150. The power measurement engine 120 may include a current sensor to measure the amount of current at a particular sampling frequency, which may be programmable. In some embodiments, the value of the current being supplied from the power rail coming into the card is sampled at a programmable rate. This value is converted into a digital value. It is appreciated that in some embodiments the power measurement engine 120 monitors and tracks instantaneous power/current as well as its moving averages over different periods, e.g., duration 210, duration 220, duration 230, etc. It is appreciated that previous running averages may also be tracked and maintained. The power measurement engine 120 subsequently sends these values to the power throttling signal generator 130, e.g., via a system management bus.

In some embodiments, the power throttling signal generator 130 receives the measured power, e.g., instantaneous, moving average, etc., from the power measurement engine 120 as well as receiving the desired power profile from the power profile engine 110. The power throttling signal generator 130 compares the measured power to that of the desired power profile and generates a power throttling signal 132. The power throttling signal 132 may trigger power throttling via the power throttling engine 140 if the measured power, e.g., instantaneous, moving average, etc., exceeds that as indicated by a threshold/limit of the desired power profile. For example, if the moving average for the power measured for duration 210 exceeds the current limit 212, then power throttling is triggered. Similarly, if the moving average for the power measured for duration 220 exceeds the current limit 222, then power throttling is triggered. Moreover, if the moving average for power measured for duration 230 exceeds the current limit 232, then power throttling is triggered. Throttling performance of the device 150 controls the power draw. It is appreciated that the power throttling signal 132 may not trigger any power throttling if the measured power is below the indicated threshold/limit of the desired power profile.

It is further appreciated that in some embodiments, if an instantaneous measured power exceeds a particular threshold, the power throttling signal 132 triggers power throttling. In some embodiments, if two consecutive instantaneous measured powers exceed a particular threshold, the power throttling signal 132 triggers power throttling. In some embodiments, if a measured moving average, as determined by the power measurement engine 120, for a particular duration, e.g., duration 210, duration 220, duration 230, etc., exceeds the threshold, as indicated by desired power profile, and if the difference between the measured moving average and its previous moving average is less than a particular current threshold, then a throttle event is triggered. In some embodiments, each time that power throttling is triggered the throttling amount may be increased, e.g., increase by 10%, increase by 20%, etc. In contrast, if power throttling is not triggered, then the throttling amount may be decreased, e.g., by 10%, by 20%, by 2%, etc. In other words, the power throttling signal 132 may indicate whether any power throttling is needed and if so, by how much. It is appreciated that in some embodiments, the amount of power throttling may be a default value, e.g., 10%, and in some embodiments, the amounts of power throttling may differ from one another depending on the event that causes power throttling to be triggered. For example, if the moving average for the power measured for duration 210 exceeds the current limit 212, then power throttling may be triggered and its value may be different from when the moving average for the power measured for duration 220 exceeds the current limit 222. It is appreciated that the power throttling signal 132 may adjust the amount of throttling over time by increasing and decreasing the throttling amount. For example, if the power throttling is triggered and if power consumption is not decreased as fast as needed, e.g., the difference between the measured power that triggers power throttling and the measured power after power throttling is below a certain threshold, e.g., 200 mW, then the amount of power throttling may be increased. It is appreciated that the threshold used to determine whether power consumption is being reduced as fast as desired may be programmable. For example, in some embodiments, the threshold of 300 mW, 52 mW, etc., may be used.

It is appreciated that the desired power profile, power throttling triggering events, and the amount of power throttling as corrective action may be programmable. For example, in the illustrated embodiment, 3 current limits are programmed for 3 durations. Any of these parameters may be programmed differently and the number of current limits and the number of durations may be changed. Moreover, certain current limits without any duration may be programmed. For a nonlimiting example, a sudden spike of current even if it is for a short period of time (i.e. instantaneous) may be unacceptable, thereby requiring the power throttling to be triggered.

In some embodiments, the power throttling engine 140 receives the power throttling signal 132. Based on the whether a power throttling is triggered and based on the value of the power throttling signal 132, the power throttling engine 140 initiates the power throttling process. In some embodiments, the power throttling engine 140 generates the throttled clocking signal 142. The throttled clocking signal 142 is a modified version of the clocking signal where certain clocking signal pulses are squashed, thereby changing the duty cycle of the clock without changing the frequency, therefore eliminating a need to change the chip architecture to adapt to different clocking mechanisms. In some embodiments, for a 10% throttle one out of every 10 clock edge may be removed, for a 20% throttle two out of every 10 clock edge may be removed, etc. In other words the clock frequency is dialed up and down efficiently without requiring the chip to accommodate pulse of varying width. Also, it is appreciated that speed is reduced without disabling any functionality.

In some embodiments, the throttled clocking signal 142 is transmitted to the device 150. Accordingly, the device 150 operates with the throttled clocking signal 142, e.g., at a lower speed if power throttling is triggered, instead of operating with the clocking signal that is at a higher speed. It is appreciated that as device 150 operates with the throttled clocking signal 142, the power consumption of the device 150 may continuously be monitored and if the amount of power consumption has decreased by a threshold amount then the throttling may enter into a recovery mode where the throttling amount is decreased from its previous value. Similarly, if the power consumption of the device 150 falls to below the desired power profile threshold, e.g., for duration 220, for duration 230, for duration 210, etc., then the power throttling may not be triggered or its amount may be set to no throttling in order to transition the device 150 back to its full performance mode. It is appreciated that this process may be continuously repeated as long as the device 150 is operational.

In some embodiments, the device 150 may include a host coupled to a memory (e.g., DDR) (not shown) and a core engine (not shown). The memory may be coupled to a direct memory access (DMA) engine (not shown) and network interface controller (NIC) (not shown) in order to receive external data. The memory may internally be connected to a data streaming engine (not shown). The core is coupled to an instruction-streaming engine (not shown), which is coupled to the data streaming engine. The core is also coupled to a general processor (not shown). In some embodiments, the general processor can be part of the core. The instruction-streaming engine and the data streaming engine are coupled to an inference engine (not shown) that includes the dense operation engine (not shown) and irregular operation engine (not shown). It is appreciated that the inference engine may include an array (not shown) for performing various computations.

It is appreciated the inference engine may include a plurality of processing tiles (not shown) arranged in a two-dimensional array of a plurality of rows and columns, e.g., 8 rows by 8 columns. Each processing tile may include at least one OCM (not shown), one POD unit (not shown) and one processing engine/element (PE) (not shown). Here, the OCMs in the processing tiles are configured to receive data from the data streaming engine in a streaming fashion. The OCMs enable efficient local access to data per processing tile. The processing units, e.g., the PODs and the PEs are configured to perform highly specialized tasks, e.g., dense and sparse computations of a ML operation on the received data in the OCMs, respectively. It is appreciated that the OCM of a respective processing tile may receive the data for various ALU operation associated with ML operation.

In some embodiments, the inference engine includes the dense operation engine that is optimized to efficiently process dense data with regular operations, e.g., matrix operations such as multiplication, matrix manipulation, tan h, sigmoid, etc. On the other hand, the inference engine may also include the irregular operation engine that is optimized to efficiently process sporadic data with irregular operations, e.g., memory transpose, addition operation, operations on irregular data structures (such as trees, graphs, and priority queues). According to some embodiments, the core may coordinate some of the instructions received from the host to be processed by the general processor, e.g., a CPU, etc.

Figure 3A:
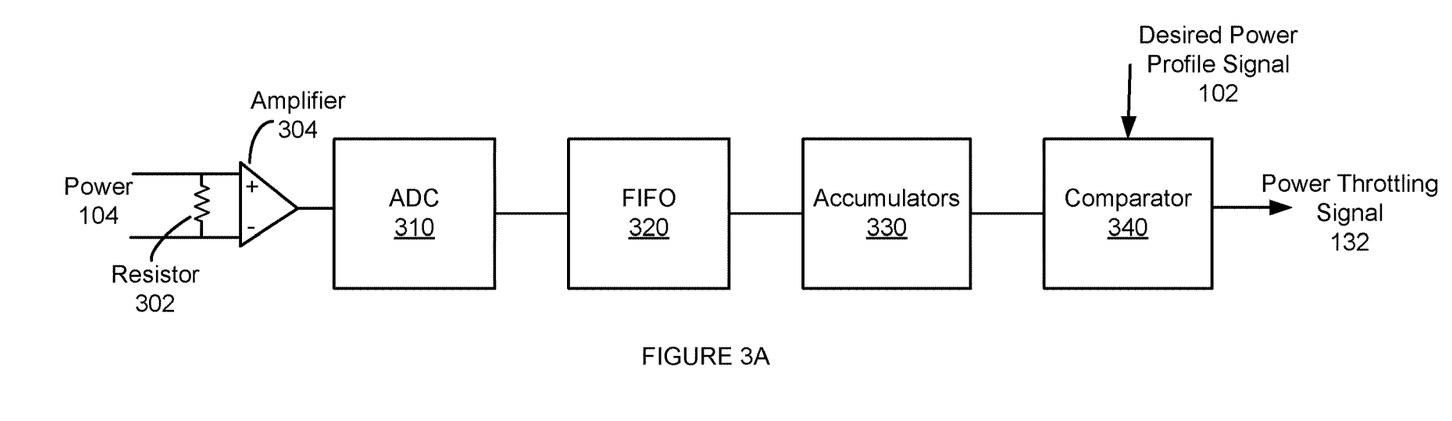
FIGS. 3A-3B show power measurement engine and power throttling signal generator according to one aspect of the present embodiments.
Figure 3B:
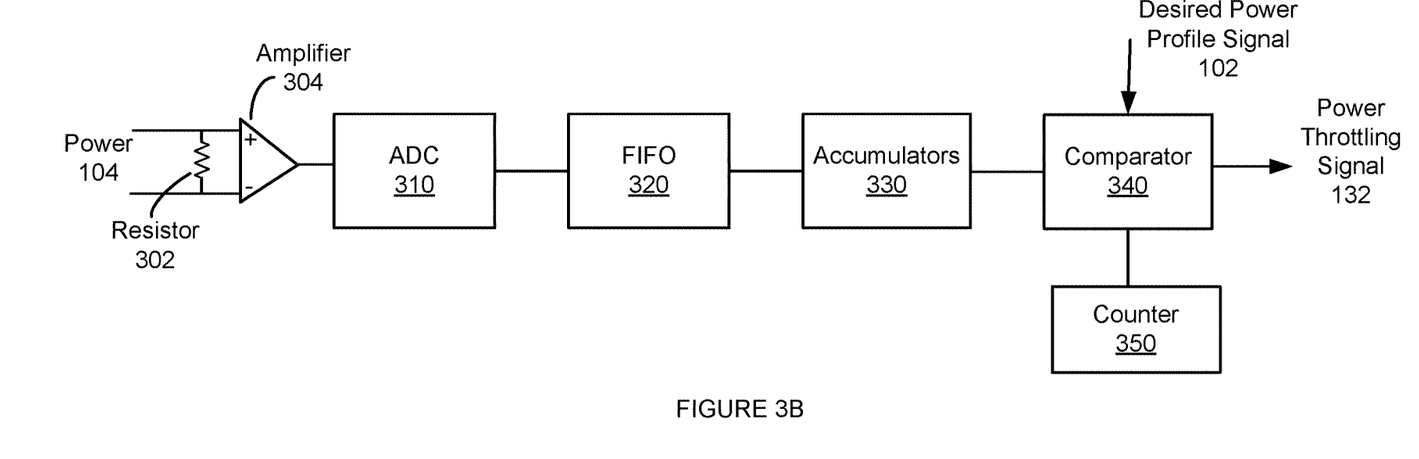

FIGS. 3A-3B show examples of a power measurement engine 120 and a power throttling signal generator 130 according to one aspect of the present embodiments. In some embodiments, a resistor 302 and an amplifier 304 are used to measure power 104. In some embodiments, a current sensor may be used. It is appreciated that a current on the main rail may be sensed and sampled at a programmable rate, e.g., 1 us, 2 us, 5 us, etc. The sensed current (i.e. power) may be converted into a digital format using an analog-to-digital converter (ADC) 310. In some embodiments, the digital values are sent to a first-in-first-out (FIFO) 320. As such, as new measured values are received the old values are discarded. In some embodiments, the FIFO 320 may be a 128 entry FIFO. The values in the FIFO 320 may be sent to accumulators 330.

It is appreciated that a number of accumulators may be used, e.g., a first accumulator may be used for averaging for duration 210, a second accumulator may be used for averaging for duration 220, a third accumulator may be used for averaging for duration 230, etc. According to some embodiments, as new values are received, they are added to each accumulator and the oldest values are subtracted. Accordingly, the accumulators 330 contain the most recent samples. It is appreciated that in some embodiments, the content of each accumulator may be divided by the number of samples in order to obtain the average. It is appreciated that in some embodiments, one or more accumulators may be used to track whether two or more consecutive measured samples behave in a particular fashion. For example, one accumulator may be used to track whether two consecutive measured samples exceed a certain threshold, e.g., the first one exceeding 40 W and the second one exceeding 37 W.

It is appreciated that a comparator 340 may be used to determine whether the accumulator's sample average exceeds the threshold, as defined by the desired power profile. In some embodiments, the comparator 340 may be used in determining whether two or more consecutive measured samples behave in a particular fashion, e.g., exceeding a threshold. In response to the comparator 340, e.g., if the threshold is exceeded, a power throttling event may be triggered. As described above, the amount of power throttling may be programmable. For example, the amount of power throttling may be different if current limit 212 is exceeded as opposed to current limit 222. It is appreciated that more than one event may cause a power throttling event to be triggered. For example, both current limit 212 for duration 210 and current limit 232 for duration 230 may be exceeded causing the power throttling event to be triggered.

In some embodiments, the greatest power throttling value associated with the power throttling event may be selected when multiple power throttling events occur. It is appreciated that in some embodiments, if the newest sample average, e.g., power/current moving average, is trending lower than its previous value by a programmable amount, no change to the throttling amount is applied. However, it is appreciated that the triggering events, the amount of power throttling, the desired power profile, the amount of power throttling in recovery mode, etc., are all programmable and the specific operational details, as described herein, are for illustrative purposes and should not be construed as limiting the scope of the embodiments. The comparator 340 generates the power throttling signal 132 that indicates whether a power throttling event has occurred, thereby triggering power throttling and if so the amount of power throttling. In some embodiments, a 4 bit signal in one nonlimiting example to indicate the amount of power throttling needed. For example, a 0000 signal indicated no throttling, 0001 may indicate 10% throttling, 0010 may indicate 20% throttling, 0011 may indicate 30% throttling, etc.

An example of a script of pseudo-code for processing new samples for the FIFO 320 is shown below

```
throttle_inc = 0;
throttle_hold = 0;
for(i=0; i<8; i++)
{
   if (ILIMIT[i].Samples !=0)) // Make sure check is enabled
   {
      accumulator[i] += FIFO[0];
      accumulator[i] -= FIFO[ILIMIT[i].Samples];
      new_avg[i] = accumulator[i]/ILIMIT[i].Samples;
      if(new_avg[i] > ILIMIT[i].LIMIT)
      {
         if (!ILIMIT[i].Trending ||
             ((prev_avg[i] - new_avg[i]) < TRENDING_DIFF)
         {
            throttle_inc = (throttle_inc < ILIMIT[i].Throttle) ?
                ILIMIT[i].Throttle : throttle_inc;
         }
         else
         {
            throttle_hold = 1;
         }
      }
      prev_avg[i] = new_avg[i];
   }
}
max_throttle = (LIMIT.Max_Throttle > 9) ?
9 : LIMIT.Max_Throttle;
min_throttle = (LIMIT.Min_Throttle > max_throttle) ?
              max_throttle : LIMIT.Min_Throttle;
if(throttle_inc == 0)
{
   ca_throttle = throttle_hold ? ca_throttle :
                 (((ca_throttle - THROTTLE_RECOVERY) <
                 min_throttle) ? min_throttle :
                 (ca_throttle - THROTTLE_RECOVERY));
}
else
{
   ca_throttle = ((ca_throttle + throttle_inc) > max_throttle) ?
                 max_throttle :
                 (((ca_throttle + throttle_inc) < min_throttle) ?
                 min_throttle : (ca_throttle + throttle_inc));
}
```

FIG. 3B is substantially similar to that of FIG. 3A except that FIG. 31B also includes a counter 350 coupled to the comparator 340. The counter 350 may be a single counter or a plurality of counters. The counter 350 may track various throttling related information. For example, in some embodiment, the counter 350 may track and store the number of times performance was throttled due to power throttling even being triggered. The counter 350 may also track the maximum value of the current sensed that caused performance throttling. In some embodiments, the counter 350 records the total duration of throttling due to high-current events.

Figure 4A:
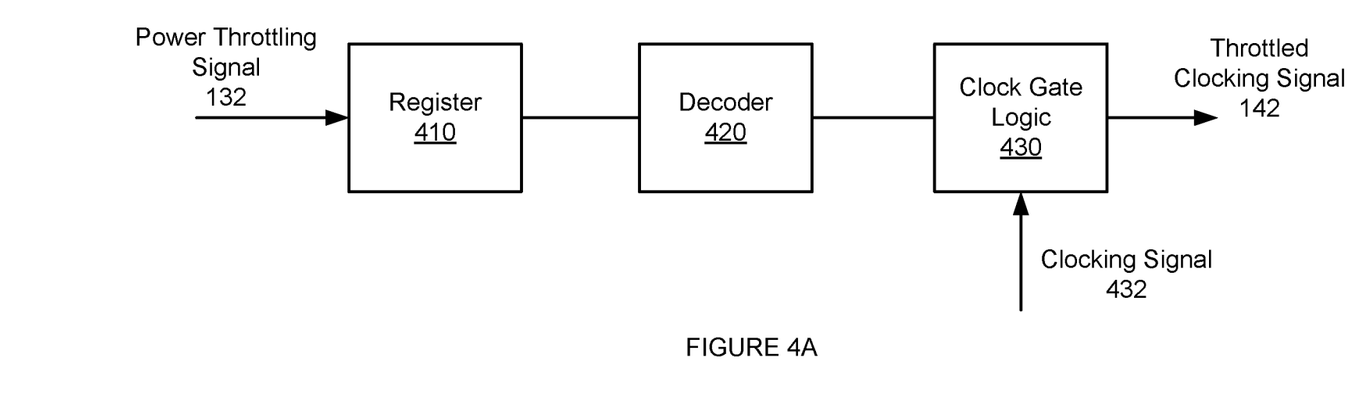
FIGS. 4A-4C show illustrative example of a power throttling engine according to one aspect of the present embodiments.
Figure 4B:
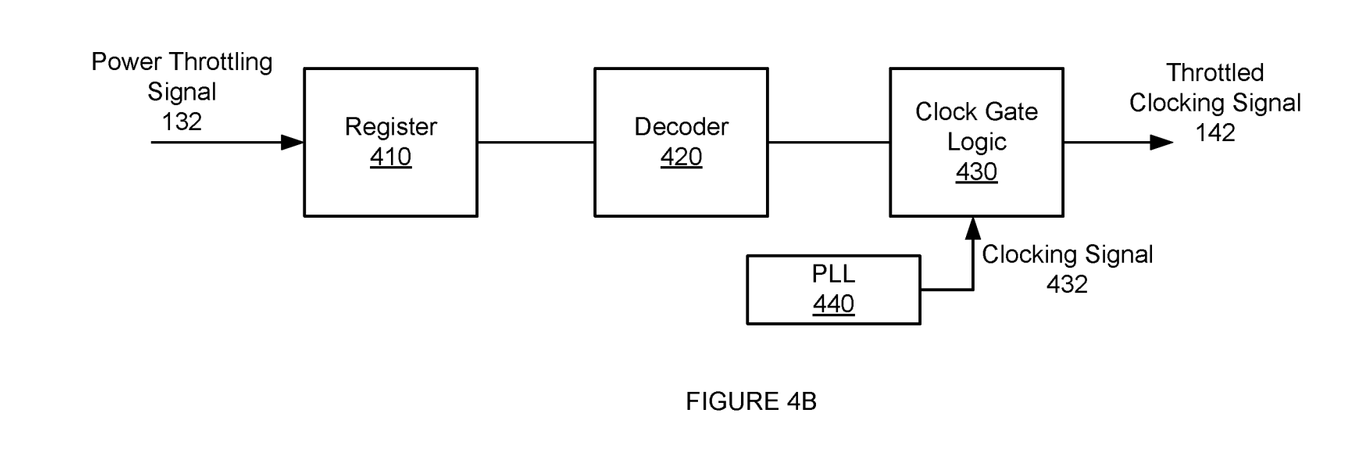
Figure 4C:
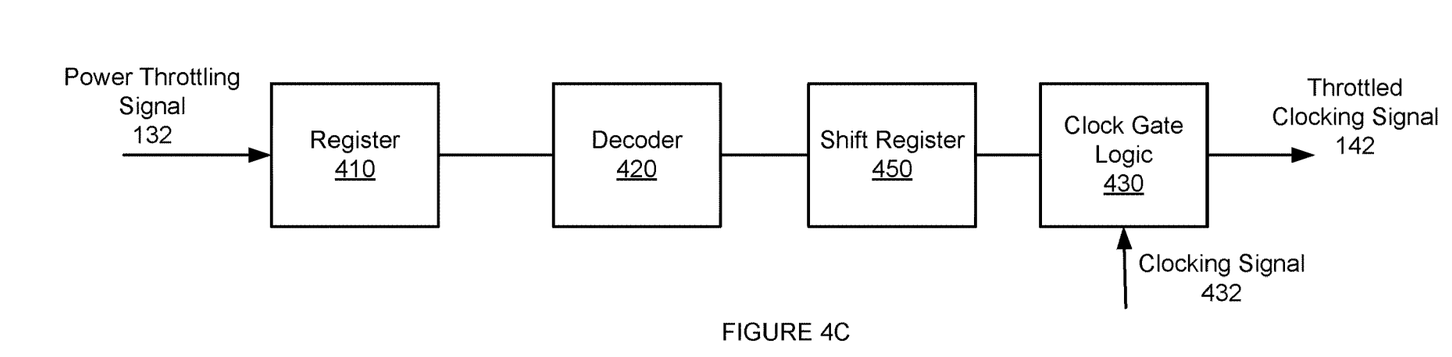
Figure 4D:
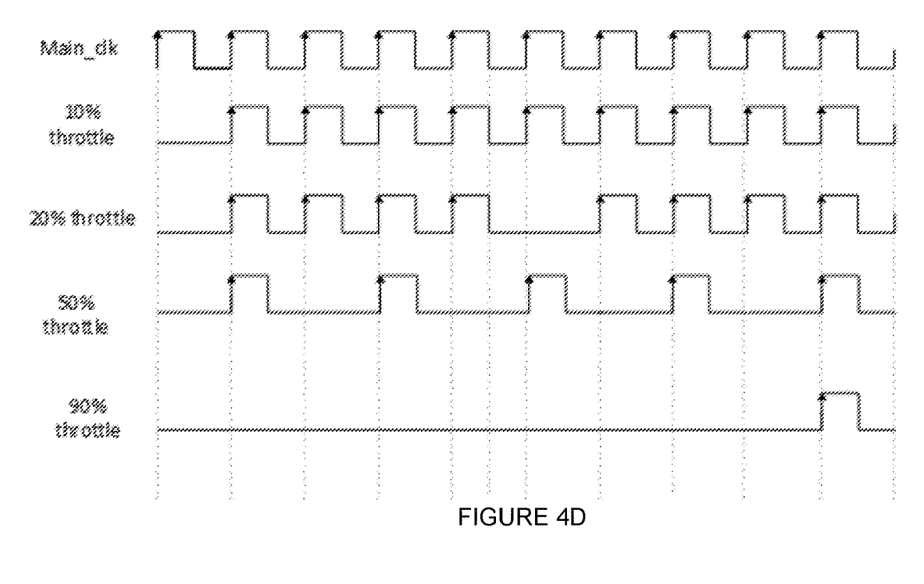
FIG. 4D shows illustrative example of a clocking signal and the throttled clocking signal according to one aspect of the present embodiments.

FIGS. 4A-4C show illustrative examples of a power throttling engine according to one aspect of the present embodiments. The power throttling engine 140 may include a register 410 configured to receive the power throttling signal 132 from the power throttling signal generator 130. The received power throttling signal 132 may be a 4-bit signal, as described above. The received power throttling signal 132 is transmitted to a decoder 420 configured to decode the power throttling signal 132. In some embodiments, the decoder 420 may determine whether a power throttling event has been triggered and if so, by how much power should be throttled, as described above. For example, a 0000 signal indicated no throttling, 0001 may indicate 10% throttling, 0010 may indicate 20% throttling, 0011 may indicate 30% throttling, a 0100 signal indicated 40% throttling, 0101 may indicate 50% throttling, 0110 may indicate 60% throttling, 0111 may indicate 70% throttling, 1000 may indicate 80% throttling, and 1001 may indicate 90% throttling. It is appreciated that a 4-bit power throttling signal 132 and power throttling in percentages are shown for illustrative purposes and should not be construed as limiting the scope of the embodiments. For example a 5-bit power throttling signal 132 may be used to indicate different throttling values. It is appreciated that in some nonlimiting examples, the decode power throttling value is expressed in a binary vector. For example, a 10% throttling may be represented as a 10-bit vector where one bit has a 1 value, e.g., 0000000001, or 0000000010, 0000000100, 0000001000, etc. A 20% throttling may be represented as a 10-bit vector where two bits have a 1 value, e.g., 1000010000, or 0100001000, or 0010000100, or 0001000010, 0000100001, etc. A 30% throttling may be represented as a 10-bit vector where three bits have a 1 value, e.g. 1001001000, or 0100100100, or 0010010010, or 0001001001, etc. Similarly, a 40% through 90% power throttling may be represented. The clock gate logic 430 may receive the vectors, as described, as well as the clocking signal 432. The clocking edge of the clocking signal 432 may be masked according to the vector. For example, for a 0000000001 vector the $10^{th}$ rising edge of the clocking signal 432 may be squashed to achieve a 10% power throttling, for 0000000010 vector the $9^{th}$ rising edge of the clocking signal 432 may be squashed to achieve a 10% power throttling, for 0001000010 vector the $4^{th}$ and $9^{th}$ rising edges of the clocking signal 432 may be squashed to achieve a 20% power throttling, for 0010010010 vector the $3^{rd}$, the $6^{th}$, and the $9^{th}$ rising edges of the clocking signal 432 may be squashed to achieve a 30% power throttling, etc. A nonlimiting example of the clocking signal and various throttling amounts are shown in FIG. 4D for illustrative purposes.

It is appreciated that the power throttling signal implementation, as described above, is for illustrative purposes and should not be construed as limiting the scope of the embodiments. For a non-limiting example, in some embodiments, the power throttling signal may be a vector having any number of bits, e.g., n-bits. As such, a 4-bit representation or 5-bit representation discussed above is for illustrative purposes only and should not be construed as limiting the scope. Furthermore, it is appreciated that the throttling represented by bit "1" is exemplary and should not be construed as limiting the scope. For a non-limiting example, in some embodiments, bit "0" may indicate throttling, e.g., 1110 may indicate 10% throttling in the 4-bit signal illustration above. It is appreciated that, in some embodiments, the power throttling signal 132 may be represented as a value associated with the amount of throttling, e.g., value 1 indicating 10% throttling, value 2 indicating 20%, etc. However, it is appreciated that instead of the value indicating the power throttling amount, in some embodiments, the shape of the power throttling signal 132 waveform shape may be used to alter the clocking signal, thereby achieving a particular throttling amount. For a non-limiting example, an 8-bit power throttling signal vector 11000010 may remove the rising edge of the first, the second, and the seventh clocking signal, achieving a 37.5% power throttling. It is further appreciated that, in some embodiments, the shape of the waveform and squashing the clock edge may be based on the bit values "1" or the inverse bit values "0." For a non-limiting example, in the 8-bit power throttling signal vector above, the same result may be achieved for 00111101 if the "0" bit is construed as the squashing signal indication. It is further appreciated that the binary representation and use for the power throttling signal vector is for illustrative purpose and should not be construed as limiting the scope of the embodiments. For a non-limiting example, in some embodiments, non-binary numbers may be used to represent the power throttling signal.

FIG. 4B is substantially similar to that of FIG. 4A except that the clocking signal 432 is generated from a phase locked loop (PLL) 440. FIG. 4C is substantially similar to that of FIG. 4A. In this embodiment, a shift register 450 is positioned between decoder 420 and the clock gate logic 430. The shift register 450 shifts the vector in order to maintain power throttling until a new vector is received.

Figure 5:
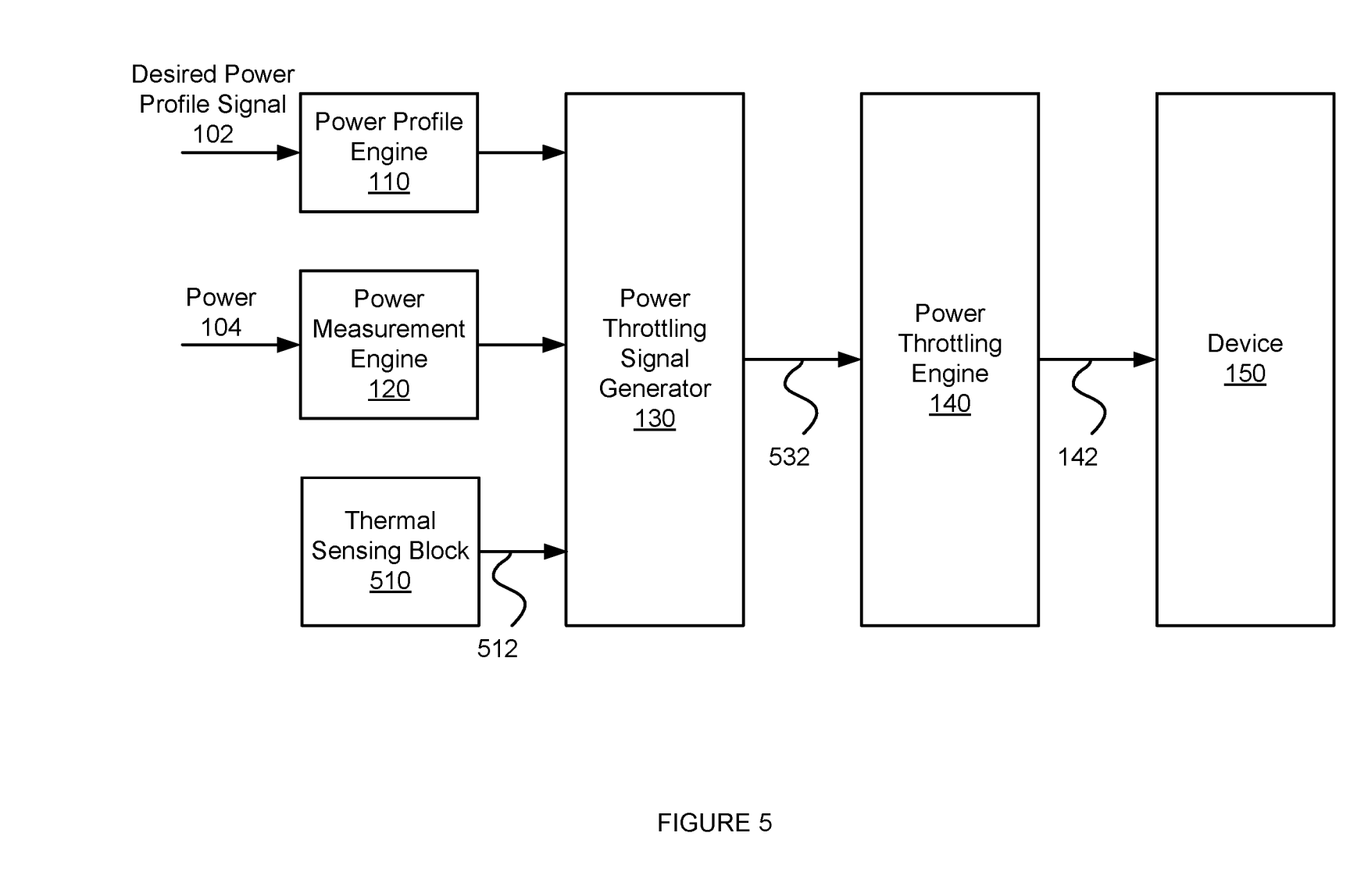
FIG. 5 shows illustrative example of a hardware-based programmable architecture configured to measure power drawn and to determine thermal profile and to throttle power, if necessary, to fit the drawn power to that of a desired power profile according to one aspect of the present embodiments.

FIG. 5 shows illustrative example of a hardware-based programmable architecture configured to measure power drawn and to determine thermal profile and to throttle power, if necessary, to fit the drawn power to that of a desired power profile according to one aspect of the present embodiments. FIG. 5 is substantially similar to that of FIG. 1. In this embodiment, a thermal sensing block 510 is also coupled to the power throttling signal generator 130. The thermal sensing block 510 is configured to generate a signal based on the measured temperature, e.g., temperature of the device 150, of a DDR, etc. It is appreciated that in some embodiments, the thermal sensing block 510 may be similar to the power measurement engine 120 in the sense that it generates a plurality of signals based on temperature, e.g., instantaneous temperature, average temperature, etc., and where the temperature is tracked over time for various durations, e.g., duration 210, duration 220, duration 230, etc. It is appreciated that high temperature within a device may need to be controlled similar to high power events. Since sudden surges in current and high chip activity cause temperature of the device or components thereof such as DDR to increase, lowering or reducing the speed lowers current/power consumption which results in decrease in temperature. As such, throttling power can be used to control the temperature.

Figure 6:
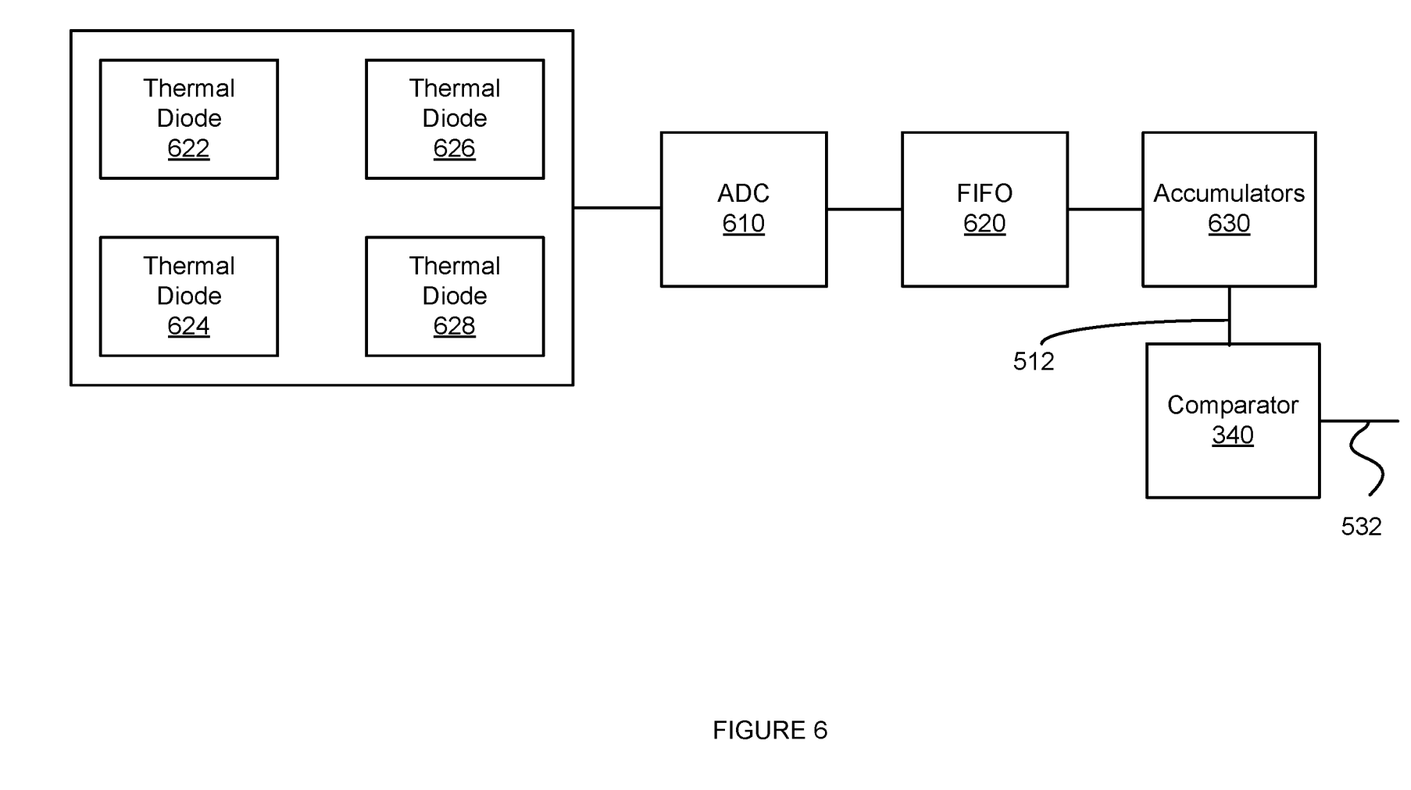
FIG. 6 shows illustrative example of thermal sensing block according to one aspect of the present embodiments.

It is appreciated that in some embodiments, the temperature may be measured and monitored using a sensor. In some embodiments, the temperature may be measured using thermal diodes. It is appreciated that one or more thermal diodes 622-628 may be used, e.g., at least one thermal diode in each chip quadrant, as shown in FIG. 6. In some embodiments, the thermal diodes 622-628 may be positioned in close proximity of hotspots, e.g., DDR, etc., within the chip (i.e. device 150). The measured temperature may be converted into a digital format using ADC 610 (which operates similar to ADC 310 as described above) and the digital temperature may be stored in the FIFO 620 (which operates similar to FIFO 320 as described above), as described in FIGS. 3A-3B. In some embodiments, a number of accumulators within accumulators 630 (which operate similar to accumulators 330 as described above) may be used to track various conditions involving temperature, e.g., average temperature of a DDR, average temperature of the device 150, and/or instantaneous temperature of the device 150 exceeding a particular threshold, etc. Digital triggers may be added to generate thermal events. For example, a thermal event may be triggered if the temperature of the device 150 exceeds a certain threshold, e.g., 105° C., 115° C., etc. In some nonlimiting examples a thermal event may be triggered if a DDR temperature exceeds a certain threshold, e.g., 75° C., 85° C., etc. In some embodiments, the thermal event may be an instantaneous thermal event or a moving average over a particular period of time, e.g., duration 210, duration 220, duration 230, etc., exceeding a particular thermal threshold, as an example. As an illustrative example, a thermal event may be described as the device 150 temperature being greater than 105° C., or either a first or a second DDR temperature being greater than 85° C. In some nonlimiting examples, a thermal event may be triggered if the temperature of the device 150 is greater than 115° C., or either the first or the second DDR temperature is greater than 95° C.

In some embodiments, the power throttling signal generator 130 including the comparator 340 (or a different dedicated comparator) may be used to determine whether a thermal event has occurred. In some embodiments, a processor (not shown) may be used to determine whether a thermal event has occurred instead of using the comparator 340. Once it is determined that a thermal event requiring corrective action has occurred, the power throttling signal generator 130 generates a thermal event signal 532. The thermal event signal 532 may be similar to that of power throttling signal 132. The thermal event signal 532 is transmitted to the power throttling engine 140 in order to throttle power, thereby reducing the temperature and addressing the thermal event. It is appreciated that the power throttling signal generator 130, the power throttling engine 140, and the device 150 are similar to those described in FIGS. 1, 3A-4. Monitoring temperature continues and further corrective actions may be taken. For example, temperature is monitored after power is throttled and if the temperature does not fall below a threshold in a particular period of time (i.e. fast enough), further power throttling may be performed. In contrast, if the temperature falls below the threshold and exceeds another threshold (i.e. too fast), the recovery process may be initiated and power throttling may be decreased, e.g., from 30% to 20%, from 40% to 10%, etc., in order to restore performance of the device 150.

It is appreciated that the thermal diodes 622-628 may be associated with different hotspots. For example, thermal diode 622 may be associated with a first DDR, thermal diode 624 may be associated with a second DDR, thermal diode 626 may be associated with a spot within the device 150 reflective of temperature within the device 150, etc. The thermal diodes 622-628 output their temperature readings to ADC 610 in order for the analog reading to be converted into a digital format. It is appreciated that the digital data may be stored in the accumulators 630 associated with a plurality of thermal events, e.g., temperature moving average over a first duration, temperature moving average over a second duration, instantaneous temperature, etc.

It is appreciated that in some nonlimiting examples, the maximum temperature of the thermal diodes 622-628 and the historical maximum temperature register may be given access to the system management bus (SMB) module for converting the digital format into a NVMe thermal format. However, it is appreciated that in some other nonlimiting examples, the thermal diodes 622-628 may be given access to the SMB module in a round-robin fashion. According to some nonlimiting examples any of the thermal diodes 622-628 may be given access to the SMB module. It is appreciated that in some embodiments where the thermal diode 622 is associated with a first DDR and the thermal diode 624 is associated with a second DDR, then the output of the thermal diodes 622 and 624 are logically ORed together such that the highest value between the two is output to the ADC 630. It is appreciated that in some embodiments, a counter (not shown) similar to counter 350 may be used to track various throttling-related information. For example, in some embodiments, the counter may track and store the number of times performance was throttled due to a thermal event being triggered. The counter may also tack the maximum temperature value that caused performance throttling. In some embodiments, the counter records the total duration of throttling due to high-temperature events. In one nonlimiting example, the counter may track thermal events due to high DDR temperature and/or high temperature within the device 150. In some embodiments, the tracked information in the counter(s) may be provided to one or more cores through configuration interface.

Figure 7A:
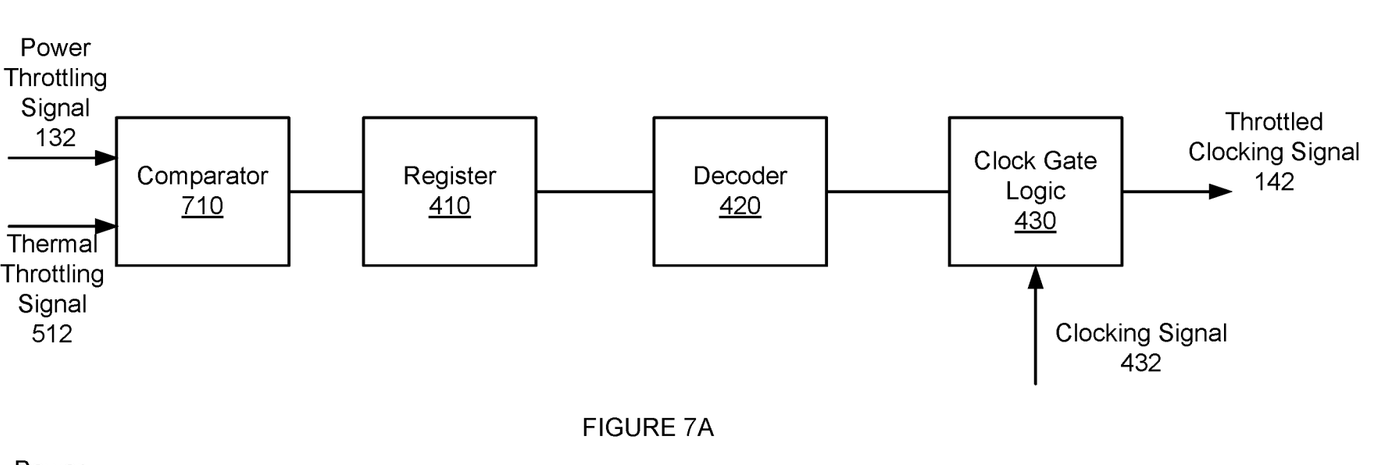
FIGS. 7A-7C show illustrative example of power throttling engine to throttle power based on thermal measurement and/or power drawn according to one aspect of the present embodiments.
Figure 7B:
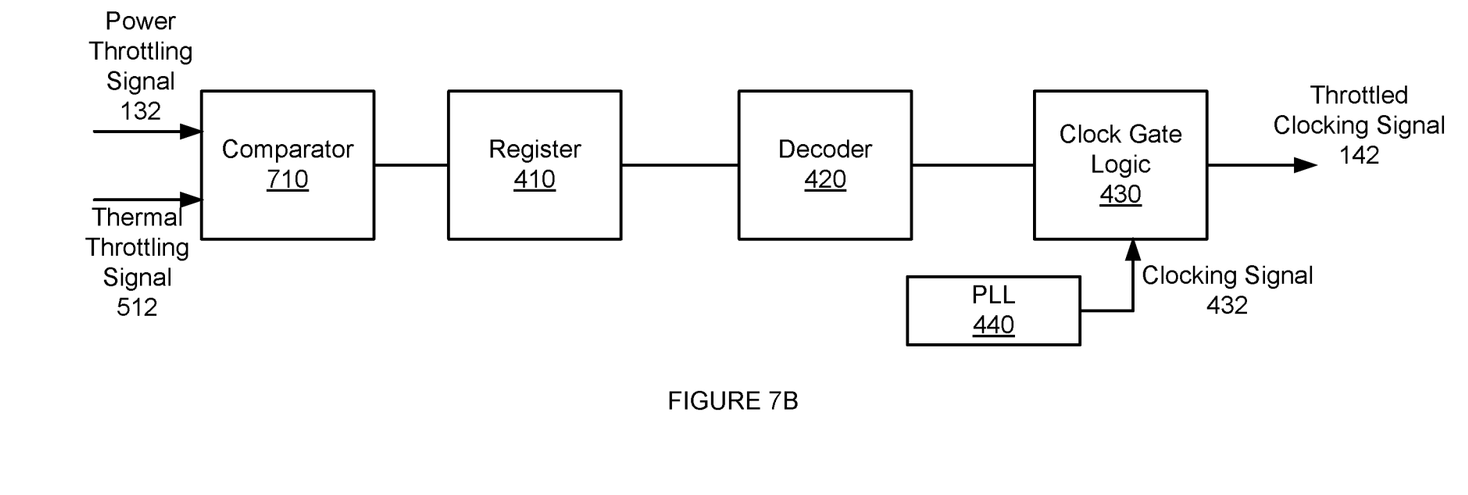
Figure 7C:
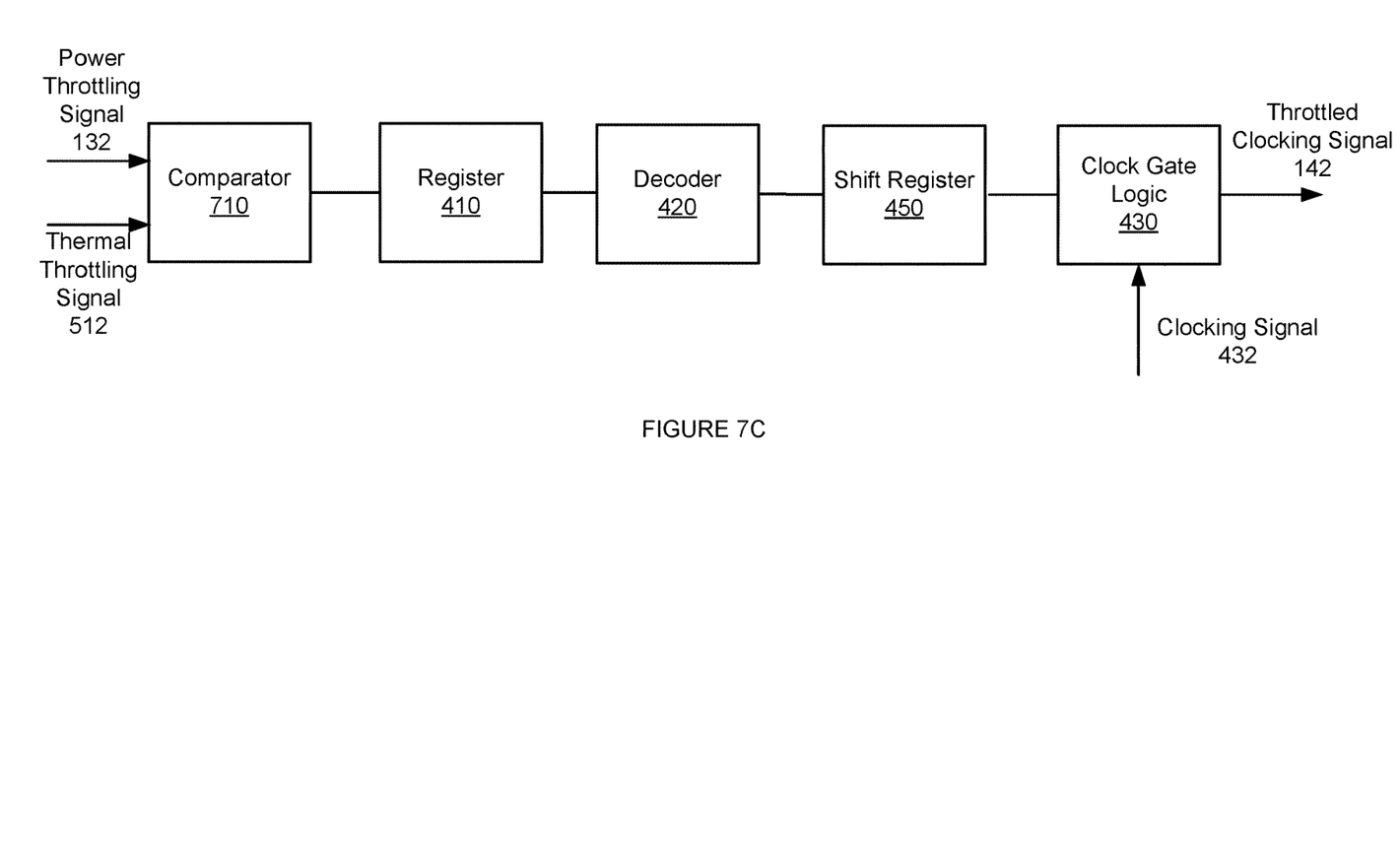

FIGS. 7A-7C show an illustrative example of power throttling engine to throttle power based on thermal measurement and/or power drawn according to one aspect of the present embodiments. FIGS. 7A-7C are similar to that of FIGS. 4A-4C except that the thermal throttling signal 512 is also received in addition to the power throttling signal 132. Accordingly, a comparator 710 is used to select between the thermal throttling signal 512 and the power throttling signal 132. In some embodiments, the comparator 710 selects a signal having a higher power throttling value because a higher power throttling value, when selected, would address and make the necessary corrective actions for both a thermal event as well as power consumption. In other words, the power measurement engine 120 and the thermal sensing block 510, each generate independent power throttling vectors, which may have a 4-bit value, as described above. The comparator 710 may compare the values, one from the power throttling signal 132 and the other from the thermal sensing block 510, to select the bigger value between the two. The selected signal is then transmitted to the register 410, which sends it to the decoder 420. Once decoded, the vector is transmitted from the decoder 420 to the clock gate logic 430 for squashing at least one or more clock pulses, as described above. It is appreciated that monitoring power throttling, power consumption and/or temperature enables additional corrective actions, e.g., further power throttling, reducing power throttling, etc., to occur, as described above. In some embodiments, power throttling for addressing high temperature may enter into recovery mode by terminating power throttling if the temperature of the device 150 falls below 100° C. and the temperature for each of the first and the second DDR falls below 81° C.

Figure 7D:
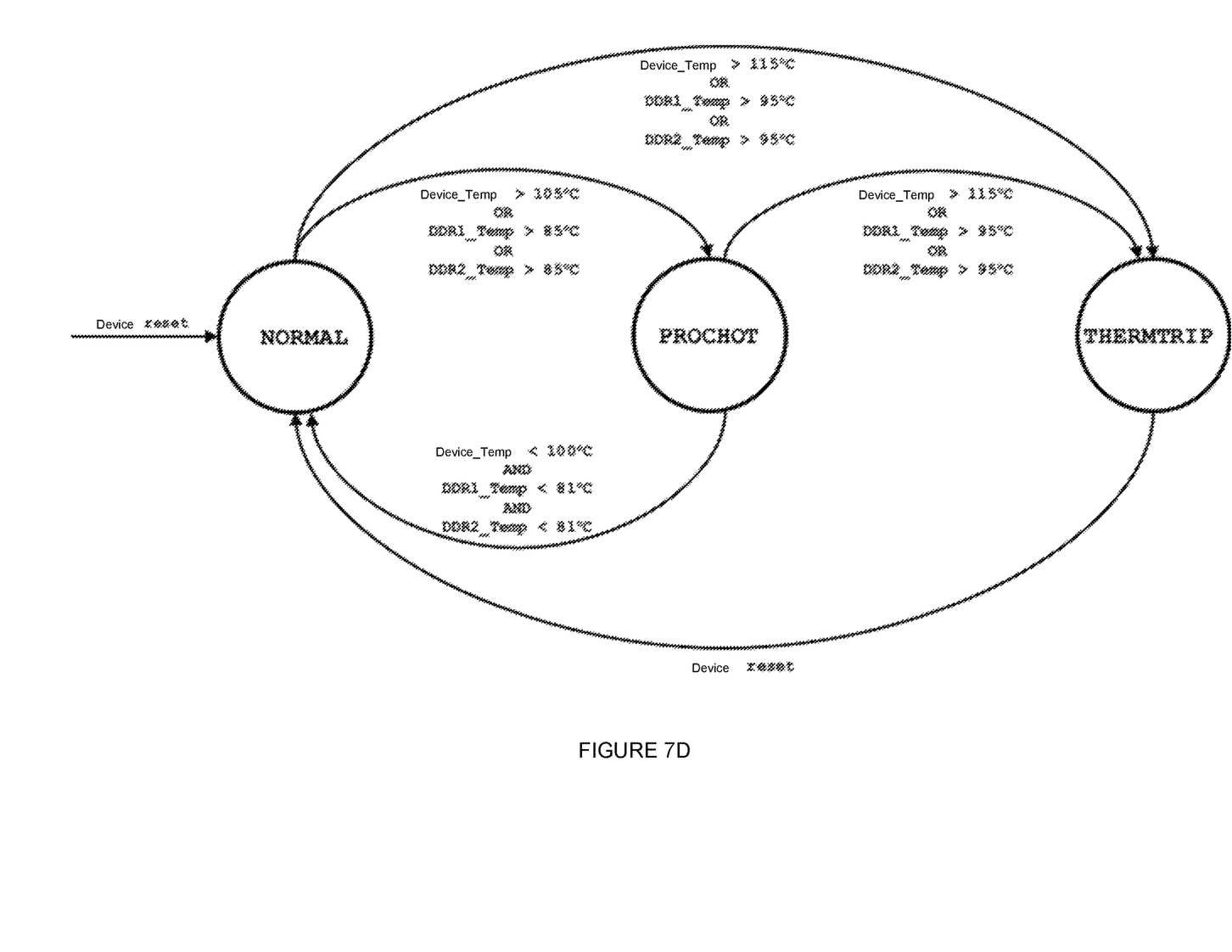
FIG. 7D shows illustrative example of a state diagram to throttle power based on thermal events according to one aspect of the present embodiments.

FIG. 7D shows a nonlimiting example of a state diagram associated with thermal events and recovery mode according to some embodiments. The illustrated state diagram shows transitioning from one state to another state when thermal events occur and/or when recovery mode is initiated, in accordance with some nonlimiting examples.

Figure 8:
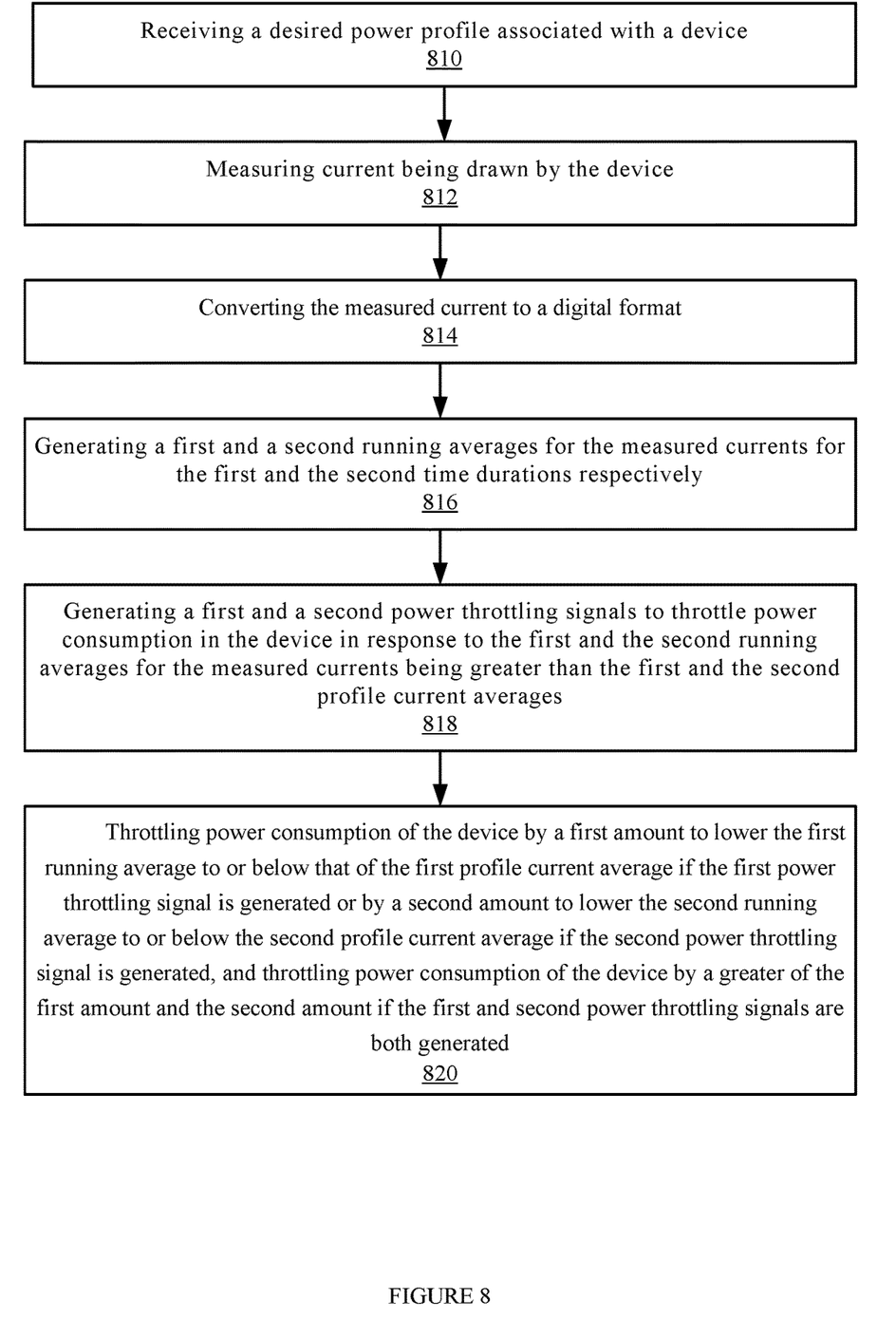
FIG. 8 shows a method for measuring power drawn and for throttling power, if necessary, to fit the drawn power to that of a desired power profile according to one aspect of the present embodiments.

FIG. 8 shows an example of a method for measuring power drawn and for throttling power, if necessary, to fit the drawn power to that of a desired power profile according to one aspect of the present embodiments. At step 810, a desired power profile associated with a device is received, as described in FIGS. 1 and 2. At step 812, current being drawn by the device is measured, as described in FIGS. 1, 3A-3B. The measured current is converted into a digital format, at step 814, as described in FIGS. 3A-3B. At step 816, a first and a second current running averages for the measured current for the first and the second durations are generated, respectively, as described in FIGS. 3A-3B. At step 818, a first and a second power throttling signals to throttle power consumption of the device are generated in response to the first and the second running averages for the measured currents being greater than the first and the second profile current averages, as described in FIGS. 1-3B. At step 820, power consumption of the device is throttled by a first amount to lower the first running average to or below that of the first profile current average if the first power throttling signal is generated, as described in FIGS. 1-4D. In some embodiments, power consumption of the device is throttled by a second amount to lower the second running average to or below that of the second profile current average if the second power throttling signal is generated, as described in FIGS. 1-4D. In some embodiments, the power of the device is throttled by the greater of the first amount and the second amount if the first and the second power throttling signals are both generated, as described in FIGS. 1-4D.

Figure 9:
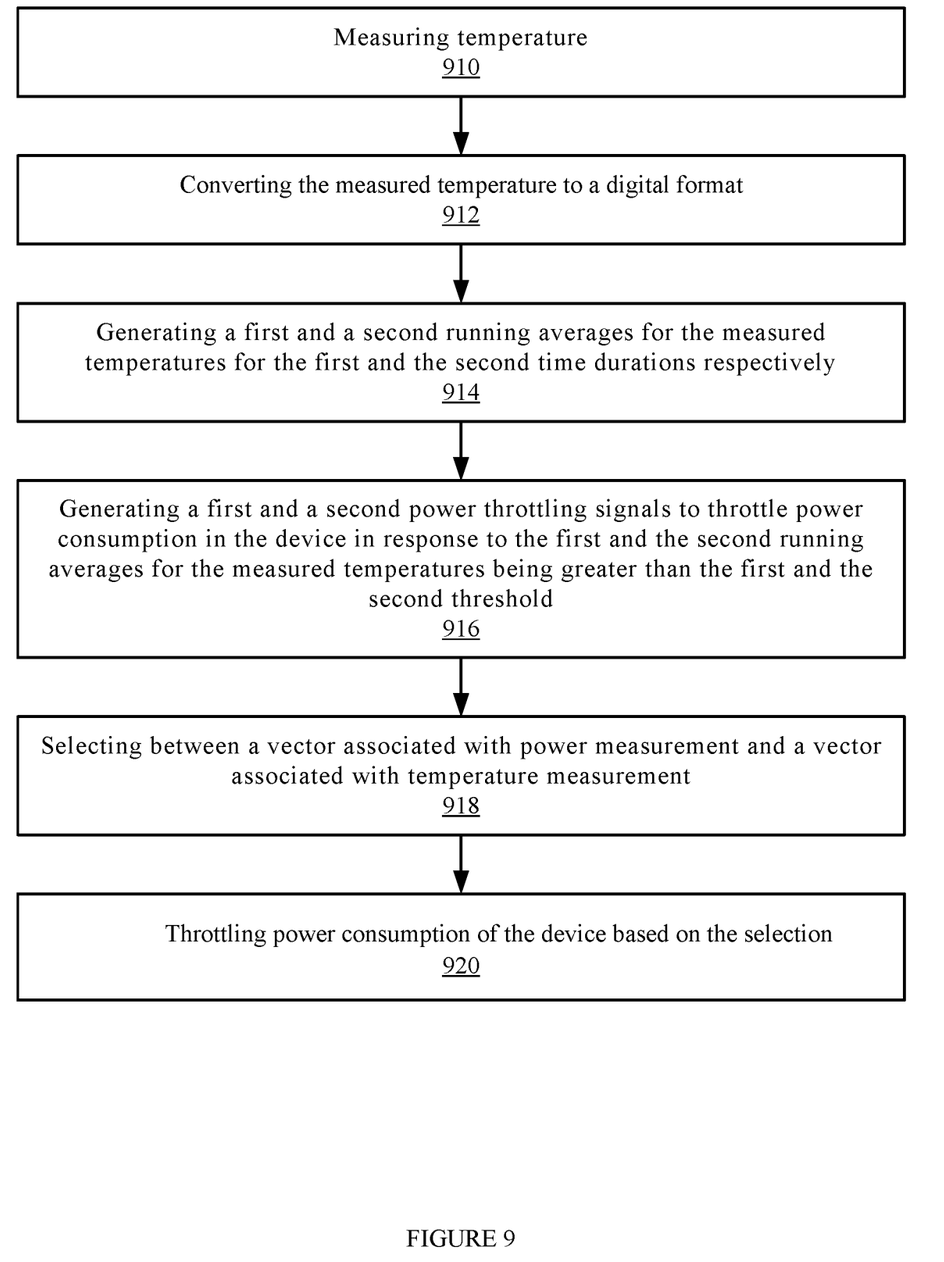
FIG. 9 shows a method for measuring temperature and for throttling power, if necessary, to lower the temperature according to one aspect of the present embodiments.

FIG. 9 shows an example of a method for measuring temperature and for throttling power, if necessary, to lower the temperature according to one aspect of the present embodiments. At step 910, temperature is measured, as described in FIGS. 5-7D. The measured temperature is converted to a digital format, at step 912, as described in FIGS. 5-7D. It is appreciated that a first and a second running averages for the measured temperatures may be generated for the first and the second durations, respectively, at step 914 and as described in FIGS. 5-7D. At step 916, a first and a second power throttling signals to throttle power consumption in the device are generated in response to the first running average for the measured temperature being greater than a first threshold and in response to the second running average for the measured temperature being greater than a second threshold, as described in FIGS. 5-7D. At step 918, a vector associated with the power measurement and a vector associated with temperature measurement is selected, as described in FIGS. 5-7D. At step 920, power consumption of the device is throttled based on the selection in step 918, as described in FIGS. 5-7D.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Embodiments were chosen and described in order to best describe the principles of the invention and its practical application, thereby enabling others skilled in the relevant art to understand the claimed subject matter, the various embodiments and the various modifications that are suited to the particular use contemplated.

What is claimed is:

1. A power throttling engine comprising:
a register configured to receive a power throttling signal;
a decoder coupled to the register, wherein the decoder is configured to generate a vector based on a value of the power throttling signal, wherein the value of the power throttling signal is an amount of power throttling of a device; and a clock gating logic configured to receive the vector and further configured to receive a clocking signal, and wherein the clock gating logic is configured to remove clock edges of the clocking signal by generating a throttled clocking signal based on the vector.

2. The power throttling engine of claim 1, wherein the throttle clocking signal is supplied as a clocking signal to the device.

3. The power throttling engine of claim 1 further comprising a phase locked loop (PLL) configured to generate the clocking signal.

4. The power throttling engine of claim 1 further comprising a shift register configured to rotate the vector for each pulse of the clocking signal.

5. The power throttling engine of claim 4, wherein the vector is maintained and rotated by the shift register until a new value associated with the power throttling signal is received.

6. The power throttling engine of claim 1, wherein the vector comprises a plurality of binary numbers, wherein an asserted bit associated with a binary number of the vector indicates no pulse squashing for its respective clock edge and wherein a de-asserted bit associated with a binary number of the vector indicated pulse squashing for its respective clock edge.

7. The power throttling engine of claim 1, wherein the device is a machine learning (ML) application specific integrated circuit (ASIC).

8. The power throttling engine of claim 1, wherein a waveform shape of the vector is used to remove the clock edges corresponding to the waveform shape.

9. The power throttling engine of claim 1, wherein a value associated with the vector is used to remove the clock edges.

10. A power throttling engine comprising:
a comparator configured to receive a power throttling signal and further configured to receive a thermal sensed signal, and wherein the comparator is configured to select one of the power throttling signal or the thermal sensed signal;
a register configured to receive the selected signal;
a decoder coupled to the register, wherein the decoder is configured to generate a vector based on a value of the selected signal, wherein the value of the selected signal is an amount of power throttling of a device; and
a clock gating logic configured to receive the vector and further configured to receive a clocking signal, and wherein the clock gating logic is configured to remove clock edges of the clocking signal by generating a throttled clocking signal based on the vector.

11. The power throttling engine of claim 10, wherein the throttle clocking signal is supplied as a clocking signal to the device.

12. The power throttling engine of claim 10 further comprising a phase locked loop (PLL) configured to generate the clocking signal.

13. The power throttling engine of claim 10 further comprising a shift register configured to rotate the vector for each pulse of the clocking signal.

14. The power throttling engine of claim 13, wherein the vector is maintained and rotated by the shift register until a new value associated with the selected signal is received.

15. The power throttling engine of claim 10, wherein the vector comprises a plurality of binary numbers, wherein an asserted bit associated with a binary number of the vector indicates no pulse squashing for its respective clock edge and wherein a de-asserted bit associated with a binary number of the vector indicated pulse squashing for its respective clock edge.

16. The power throttling engine of claim 10, wherein the device is a machine learning (ML) application specific integrated circuit (ASIC).

17. The power throttling engine of claim 10, wherein the comparator is configured to select the power throttling signal if a value of the power throttling signal is greater than the thermal sensed signal, and wherein the comparator is further configured to select the thermal sensed signal if a value of the thermal sensed signal is greater than the power throttling signal.

18. The power throttling engine of claim 10 further comprising a plurality of thermal diodes configured to generate the thermal sensed signal.

19. The power throttling engine of claim 18, wherein the plurality of thermal diodes is positioned in different quadrants of the device.

20. The power throttling engine of claim 18, wherein the generated thermal sensed signal has a first value if a temperature as measured by the thermal diode exceeds a first threshold and wherein the thermal diode is configured to generate another thermal sensed signal after a certain period of time from the generation of the thermal sensed signal, wherein the another thermal sensed signal has a second value if a temperature as measured by the thermal diode exceeds a second threshold, and wherein the second value causes larger amount of power throttling in comparison to the first value if the second value indicates that power throttling based on the first value has cooled the device slower than anticipated.

21. The power throttling engine of claim 18 further comprising an analog to digital converter to form a digital thermal sensed signal.

22. The power throttling engine of claim 18, wherein a thermal diode of the plurality of thermal diodes measures a temperature associated with a DDR memory, and wherein a thermal diode of the plurality of thermal diodes measures a temperature associated with the device.

23. The power throttling engine of claim 10 further comprising a thermal diode configured to generate the thermal sensed signal with a first value if a temperature as measured by the thermal diode exceeds a first threshold and wherein the thermal diode is configured to generate the thermal sensed signal with a second value if a temperature as measured by the thermal diode exceeds a second threshold.

24. The power throttling engine of claim 10, wherein a waveform shape of the vector is used to remove the clock edges corresponding to the waveform shape.

25. The power throttling engine of claim 10, wherein a value associated with the vector is used to remove the clock edges.

* * * * *